(12) United States Patent
Ishii et al.

(10) Patent No.: US 11,637,950 B2
(45) Date of Patent: Apr. 25, 2023

(54) IMAGE CAPTURING APPARATUS

(71) Applicant: CANON KABUSHIKI KAISHA, Tokyo (JP)

(72) Inventors: Kenji Ishii, Kanagawa (JP); Takashi Yoshida, Tokyo (JP); Koji Tamura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/672,264

(22) Filed: Feb. 15, 2022

(65) Prior Publication Data
US 2022/0294954 A1  Sep. 15, 2022

(30) Foreign Application Priority Data

Mar. 12, 2021  (JP) .............................. JP2021-040119

(51) Int. Cl.
| H04N 5/225 | (2006.01) |
| H04N 5/232 | (2006.01) |
| H05K 7/20 | (2006.01) |

(52) U.S. Cl.
CPC ....... *H04N 5/22521* (2018.08); *H04N 5/2253* (2013.01); *H04N 5/22525* (2018.08); *H04N 5/23287* (2013.01); *H05K 7/20409* (2013.01); *H05K 7/20963* (2013.01); *H05K 7/20972* (2013.01)

(58) Field of Classification Search
CPC ........... H04N 5/22521; H04N 5/22525; H04N 5/2253; H04N 5/23287; H04N 5/2252; H05K 7/20409; H05K 7/20963; H05K 7/20972; G03B 17/02; G03B 17/55

USPC ...................................................... 348/208.7
See application file for complete search history.

(56) References Cited

U.S. PATENT DOCUMENTS

| 10,727,155 | B2 * | 7/2020 | Shibata ............ H04N 5/225251 |
| 11,190,671 | B2 * | 11/2021 | Wada .................. H05K 7/20154 |
| 2009/0002549 | A1 * | 1/2009 | Kobayashi ......... H04N 5/22521 |
| | | | 348/374 |
| 2014/0055667 | A1 * | 2/2014 | Kawamura ............ G02B 7/028 |
| | | | 348/373 |

(Continued)

FOREIGN PATENT DOCUMENTS

| JP | 2015204422 A | 11/2015 |
| JP | 2017228876 A | 12/2017 |

*Primary Examiner* — Lin Ye
*Assistant Examiner* — Chan T Nguyen
(74) *Attorney, Agent, or Firm* — Canon U.S.A., Inc. I.P. Division (57) ABSTRACT

An image capturing apparatus, including an image capturing element and having an optical axis, includes a control circuit to control the image capturing apparatus, a display panel arranged on a rear surface side of an exterior member, and a heat dissipation fan arranged on a bottom surface side of the exterior member. An image capturing element board, a control circuit board, and the display panel are arranged in a direction of the optical axis. A duct, extending from a first ventilation hole to a second ventilation hole formed to face the first ventilation hole across the optical axis, passes through an area among the image capturing element board, the control circuit board, and the bottom surface side of the exterior member. The heat dissipation fan is arranged inside the duct arranged in the area, the control circuit board, and the bottom surface side of the exterior member.

8 Claims, 7 Drawing Sheets

(56) References Cited

U.S. PATENT DOCUMENTS

2018/0107099 A1* 4/2018 Yasuda .................. G03B 17/55
2019/0154949 A1* 5/2019 Hosoe .................... G02B 7/028
2019/0373765 A1* 12/2019 Naito ................ G02F 1/133385
2019/0385927 A1* 12/2019 Shibata ............ H04N 5/225251
2021/0289110 A1* 9/2021 Ogawa ................. H04N 5/2253

* cited by examiner

IMAGE CAPTURING APPARATUS

BACKGROUND

Field

The present disclosure relates to an image capturing apparatus including a heat dissipation structure for heat generated from a heat source.

Description of the Related Art

With a demand for miniaturization of electronic devices in recent years, miniaturization and high density of components mounted inside the devices have become remarkable.

On the other hand, a demand for higher functionality of an image capturing apparatus, especially higher performance of a moving image function is steadily increasing, and a heat generation amount of the device tends to increase.

In moving image capturing in a high temperature environment, there is a high possibility that a mounted component malfunctions or deteriorates its performance and causes a failure of an image capturing apparatus with an increase in temperature inside the image capturing apparatus.

Recently, image capturing apparatuses have become widely used which correct a blur by moving an image capturing element in a direction perpendicular to an optical axis direction to improve image quality.

Even in the above-described image capturing apparatus, which performs blur correction, heat generated in the image capturing element at the time of driving a blur correction mechanism, continuous image capturing, and moving image capturing affects the image quality, so that sufficient heat dissipation is required.

Thus, in a case where a natural heat dissipation amount is not sufficient with respect to a heat generation amount of the image capturing apparatus, a heat dissipation structure that performs forced air cooling using a fan is used.

According to Japanese Patent Application Laid-Open No. 2017-228876, an apparatus is discussed which uses a fan located on a bottom surface of a camera to exhaust air in a gap between a heatsink for an image capturing element and a heatsink for a circuit board facing the heatsink for the image capturing element to the outside.

According to Japanese Patent Application Laid-Open No. 2015-204422, an apparatus is discussed in which an L-shaped heatsink and duct including a blower fan is arranged between an image capturing element and a main board.

However, according to the apparatus discussed in the above-described Japanese Patent Application Laid-Open No. 2017-228876, there is an issue that the outside air is directly drawn into the apparatus, so that dust and dirt easily enter the apparatus from the outside.

Further, according to the apparatus discussed in Japanese Patent Application Laid-Open No. 2015-204422, there is an issue that the fan is arranged in a part of the heatsink and duct, and thus a size of the apparatus is increased.

SUMMARY

An aspect of an embodiment of the present disclosure is directed to the provision of an image capturing apparatus that satisfies a heat dissipation performance while suppressing an increase in size of the apparatus.

According to an aspect of the present disclosure, an image capturing apparatus including an image capturing element and having an optical axis includes a control circuit configured to control the image capturing apparatus, a display panel arranged on a rear surface side of an exterior member, and a heat dissipation fan arranged on a bottom surface side of the exterior member, wherein an image capturing element board on which the image capturing element is mounted, a control circuit board on which the control circuit is mounted, and the display panel are arranged in an order from a front surface side of the image capturing apparatus to a rear surface side of the image capturing apparatus in a direction of the optical axis, wherein a duct, in which a first ventilation hole is formed on a bottom surface side of a rear surface or a side surface of the exterior member extends from the rear surface side to the front surface side in the optical axis direction, passes through an area among the image capturing element board, the control circuit board, and the bottom surface side of the exterior member, and is connected to a second ventilation hole formed on the bottom surface side of the exterior member to face the first ventilation hole across the optical axis, and wherein the heat dissipation fan is arranged inside the duct arranged in the area among the image capturing element board, the control circuit board, and the bottom surface side of the exterior member.

Further features of the present disclosure will become apparent from the following description of exemplary embodiments with reference to the attached drawings.

DESCRIPTION OF THE EMBODIMENTS

Exemplary embodiments of a technique according to the present disclosure will be described in detail below with reference to the attached drawings.

Dimensions, materials, and shapes of components and their relative arrangements described below are to be appropriately changed depending on a configuration and various conditions of an apparatus to which the present disclosure is applied.

Thus, the scope of the present disclosure is not limited to the following descriptions.

Known arts in the field of technology or publicly known technology can be applied to configurations and processes that are not particularly illustrated or described. Further, duplicate explanations are omitted.

Elements that are the same or functionally similar are denoted by the same reference numerals in the drawings.

<Block Diagram Illustrating Example of Configuration of Digital Camera 400 According to Present Exemplary Embodiment>

Figure 7:
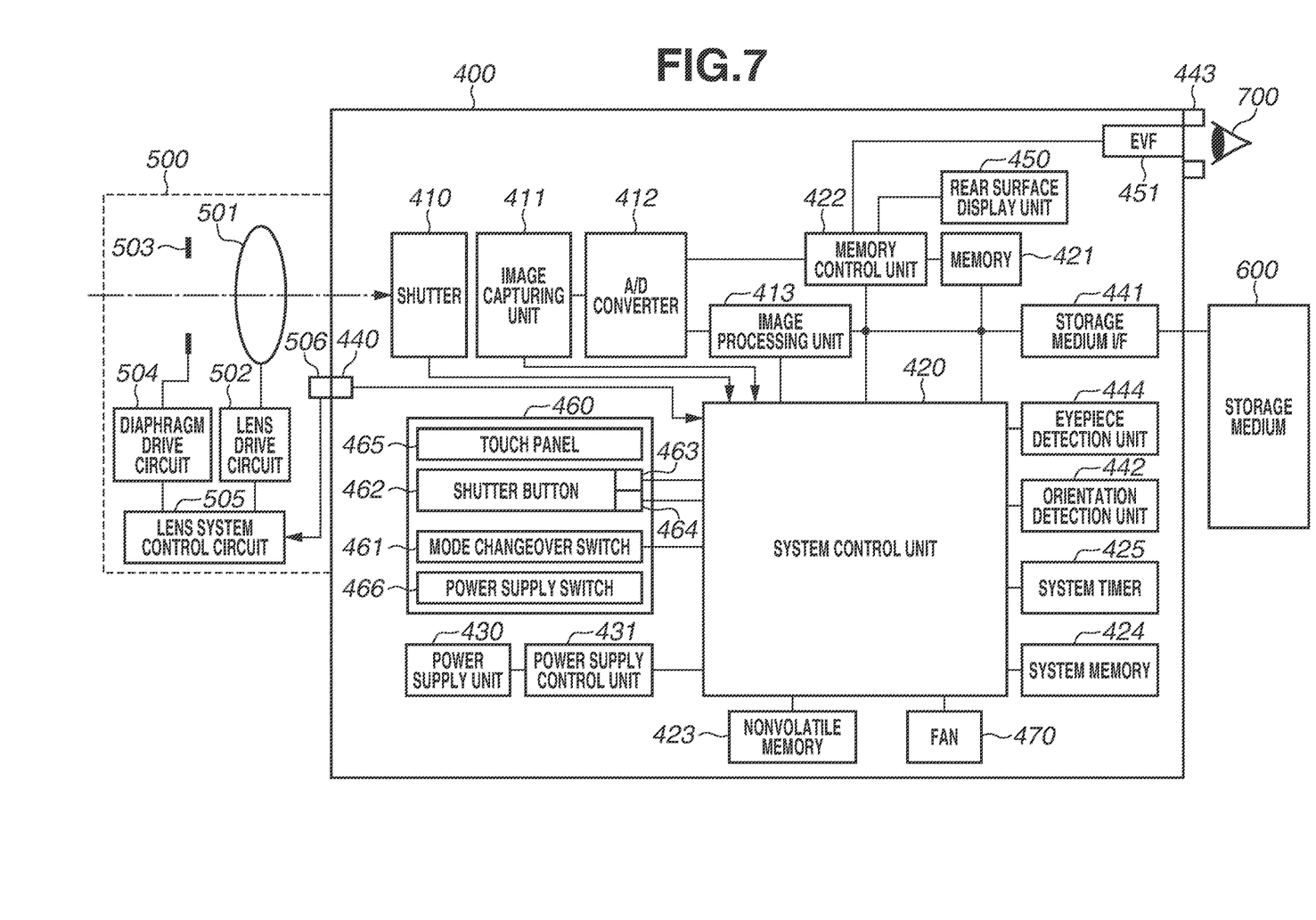
FIG. 7 is a block diagram illustrating the exemplary embodiment of the present disclosure.

FIG. 7 is a block diagram illustrating an example of a configuration of a digital camera 400 according to the present exemplary embodiment.

A shutter 410 is a focal-plane shutter, which can freely control an exposure time of an image capturing unit 411 described below. The control is performed by a system control unit 420 described below.

The image capturing unit 411 is an image capturing device that includes an imaging plane on which an object image (an optical image) passing through a lens 501 is formed and outputs an electrical signal (an analog signal) corresponding to the optical image on the imaging plane by photoelectric conversion. The lens 501 is driven in the optical axis direction by the lens drive circuit 502.

As the image capturing unit 411, a charge couple device (CCD) and a complementary metal oxide semiconductor (CMOS) sensor are used.

An analog-to-digital (A/D) converter 412 is a signal conversion unit, which is used to convert an analog signal output from the image capturing unit 411 into a digital signal.

An image processing unit 413 is an image calculation unit, which generates image data by performing predetermined pixel interpolation, resize processing such as reduction, or color conversion processing on the digital signal from the A/D converter 412 or a digital signal from a memory control unit 422 described below.

The system control unit 420 controls an aperture position and a lens position based on a calculation result obtained by the image processing unit 413.

The image processing unit 413 further performs calculation processing using the image data and performs automatic white balance (AWB) processing using a through the lens (TTL) method based on the obtained calculation result.

The system control unit 420 is a control unit including at least one processor or one circuit to control the entire digital camera 400.

Each processing according to the present exemplary embodiment is realized by executing a program stored in a nonvolatile memory 423 described below.

A memory 421 is a storage unit, which temporarily stores the digital signal obtained by the image capturing unit 411 and converted by the A/D converter 412 and the image data generated by the image processing unit 413.

The memory 421 has a sufficient storage capacity to store a predetermined number of still images, a moving image having a predetermined time length, and audio data.

The memory control unit 422 is a memory control unit, which controls transmission and reception of data controlled by the system control unit 420 to and from the A/D converter 412, the image processing unit 413, and the memory 421.

The digital signal output from the A/D converter 412 is directly written to the memory 421 via the image processing unit 413 and the memory control unit 422, or via only the memory control unit 422.

The nonvolatile memory 423 is an electrically erasable/recordable read only storage unit to store a constant, a program, and the like used for an operation of the system control unit 420.

A system memory 424 is a readable/writable storage unit, which stores a constant and a variable used for an operation of the system control unit 420, a program read from the nonvolatile memory 423, and the like.

A system timer 425 is a time measurement unit, which measures a time until auto power-off for turning off lights of various display members described below is executed and an exposure time.

The auto power-off includes a function of turning off the lights of the various display members described below in order to prevent battery consumption in a case where it is determined that a user does not operate the digital camera 400.

A power supply unit 430 includes a primary battery such as an alkaline battery and a lithium (Li) battery, a secondary battery such as a nickel-cadmium (NiCd) battery, a nickel-metal hydride (NiMH) battery, and a Li battery, and an alternate current (AC) adapter.

A power supply control unit 431 includes a circuit, which detects the power supply unit 430 as a power supply for driving the digital camera 400, a direct current to direct current (DC-DC) converter, and a switch circuit, which switches a power supply destination.

The power supply unit 430 detects whether the battery is mounted, a type of the battery, and a battery remaining amount.

The power supply control unit 431 controls the DC-DC converter based on a detection result and an instruction from the system control unit 420 and supplies a necessary voltage to a supply destination at a necessary timing.

A communication terminal 440 is provided in the digital camera 400 and is electrically connected to a lens communication terminal 506 described below.

The communication terminal 440 is electrically connected, and thus the system control unit 420, which controls the entire digital camera 400, is communicatable with a lens unit 500 described below.

A storage medium interface (I/F) 441 is an interface with a storage medium 600 described below.

An orientation detection unit 442 detects an orientation of the digital camera 400 with respect to a gravity direction.

The orientation detection unit 442 can output orientation information indicating whether an image captured by the image capturing unit 411 is an image captured by holding the digital camera 400 horizontally or an image captured by holding the digital camera 400 vertically based on the orientation detected by the orientation detection unit 442.

The system control unit 420 can add the orientation information output by the orientation detection unit 442 to the image data.

As the orientation detection unit 442, an acceleration sensor, a gyro sensor, and the like can be used.

The acceleration sensor and the gyro sensor, which are used to be as the orientation detection unit 442, can also detect a movement of the digital camera 400 (panning, tilting, lifting, remaining stationary or not, and the like).

An eyepiece portion 443 is a portion that the user brings his/her eye (object) 700 close to (into contact with) the digital camera 400.

An eyepiece detection unit 444 is an approach or eye-contact detection sensor, which detects approach (contact with the eyepiece) or separation (separation from the eyepiece) of the eye 700 with respect to the eyepiece portion 443.

The eyepiece detection unit 444 detects contact of the eye 700 with the eyepiece portion 443 based on whether a light receiving unit (not illustrated) of an infrared proximity sensor receives light.

After detecting the contact with the eyepiece, the system control unit 420 determines as being in an eye-contact state until separation from the eyepiece is detected.

After detecting the separation from the eyepiece, the system control unit 420 is in a non eye-contact state until contact with the eyepiece is detected.

The infrared proximity sensor is an example, and another sensor can be adopted as long as the eyepiece detection unit 444 can detect approach of an eye or an object, which can be regarded as the contact with the eyepiece.

The above-described memory 421 also functions as a memory (a video memory) for displaying an image.

The digital signal or the image data written in the memory 421 is displayed on a rear surface display unit 450 and an electronic viewfinder (EVF) 451 via the memory control unit 422.

The rear surface display unit 450 performs display corresponding to a signal from the memory control unit 422.

The EVF 451 performs display corresponding to a signal from the memory control unit 422 in a case where the eyepiece detection unit 444 detects contact with the eyepiece.

The digital signal stored in the memory 421 that is obtained by performing A/D conversion by the A/D converter 412 on the analog signal generated by the image capturing unit 411 is sequentially transferred to the rear surface display unit 450 or the EVF 451 to be displayed thereon.

Accordingly, live view imaging display, which is real-time display, can be performed.

The system control unit 420 switches display (a display state)/non display (a non-display state) of the rear surface display unit 450 and the EVF 451 in response to a state detected by the above-described eyepiece detection unit 444.

During the non eye-contact state, an image is displayed on the rear surface display unit 450 and is not displayed on the EVF 451.

On the other hand, during the eye-contact state, an image is displayed on the EVF 451 and is not displayed on the rear surface display unit 450.

An operation unit 460 includes various operation members as input units for receiving an operation from the user.

The operation unit 460 includes the various operation members (a mode changeover switch 461, a shutter button 462, a first shutter switch 463, a second shutter switch 464, a touch panel 465, and a power supply switch 466) described below.

The operation unit 460 is an operation unit for inputting various operation instructions to the system control unit 420.

The mode changeover switch 461 switches an operation mode of the system control unit 420 to any of a still image capturing mode, a moving image capturing mode, and the like.

Image capturing modes included in the still image capturing mode are an automatic image capturing mode, an automatic scene discrimination mode, and a manual image capturing mode.

Further, the image capturing modes included in the still image capturing mode are an aperture priority mode (an Av mode), a shutter speed priority mode (a Tv mode), and a program automatic exposure (AE) mode (a P mode).

Similarly, the moving image capturing mode can include a plurality of image capturing modes.

The shutter button 462 is a button used by a user to issue an image capturing preparation instruction and an image capturing instruction.

The first shutter switch 463 is turned ON in a middle of an operation of the shutter button 462 provided on the digital camera 400, namely half pressing (the image capturing preparation instruction), and generates a first shutter switch signal SW1.

An image capturing preparation operation such as automatic focus (AF) processing, automatic exposure (AE) processing, and automatic white balance (AWB) processing starts by the first shutter switch signal SW1.

The second shutter switch 464 is turned ON by completion of the operation of the shutter button 462, namely full pressing (the image capturing instruction), and generates a second shutter switch signal SW2.

The system control unit 420 performs reading of the analog signal from the image capturing unit 411 and signal conversion processing in the A/D converter 412 and the image processing unit 413 by the second shutter switch signal SW2.

Further, the system control unit 420 starts an image capturing processing operation up to writing the image data temporarily stored in the memory 421 to the storage medium 600 described below.

The touch panel 465 is a device to detect a touch or a drag operation by a user.

According to the present exemplary embodiment, the touch panel 465 is integrated with the rear surface display unit 450, and the user can perform an operation by touching a display portion of the rear surface display unit 450 with his/her finger.

The power supply switch 466 is to switch ON/OFF of the power supply. The power supply control unit 431 controls power supply from the power supply unit 430 by a switching operation of the power supply switch 466.

A fan 470 is arranged inside a duct described below according to the exemplary embodiment of the present disclosure.

The fan 470 is controlled by the system control unit 420 and exhausts heat from a heat source inside the digital camera 400 to the outside by an air flow.

The lens unit 500 is an interchangeable lens, which is attachable to and detachable from the digital camera 400.

The lens 501 is a lens group including a plurality of lenses for generating an optical image (an object image) from object light reflected on an object, but is illustrated as a single lens for simplification in FIG. 7.

The lens communication terminal 506 is a communication terminal for the lens unit 500 to communicate with the digital camera 400.

Since the lens communication terminal 506 is electrically connected to the communication terminal 440 as described above, the lens unit 500 is communicatable with the system control unit 420 that controls the entire digital camera 400.

Accordingly, the system control unit 420 communicates with a lens system drive circuit 505 and a diaphragm drive circuit 504 to control a position of a diaphragm 503 and a focus state of a real image by displacing the lens 501.

The storage medium 600 is attachable to and detachable from the digital camera 400 and is a storage medium such as a memory card for storing a captured image.

For example, the storage medium 600 includes a secure digital (SD) card, a FLASH® memory, and a hard disk.

A method for cooling an image capturing element board 11 and a main board 12, which are each above-described heat generation source, is described with reference to FIGS. 1A, 1B to FIG. 5.

<Perspective View of Image Capturing Apparatus 300>

Figure 1A:
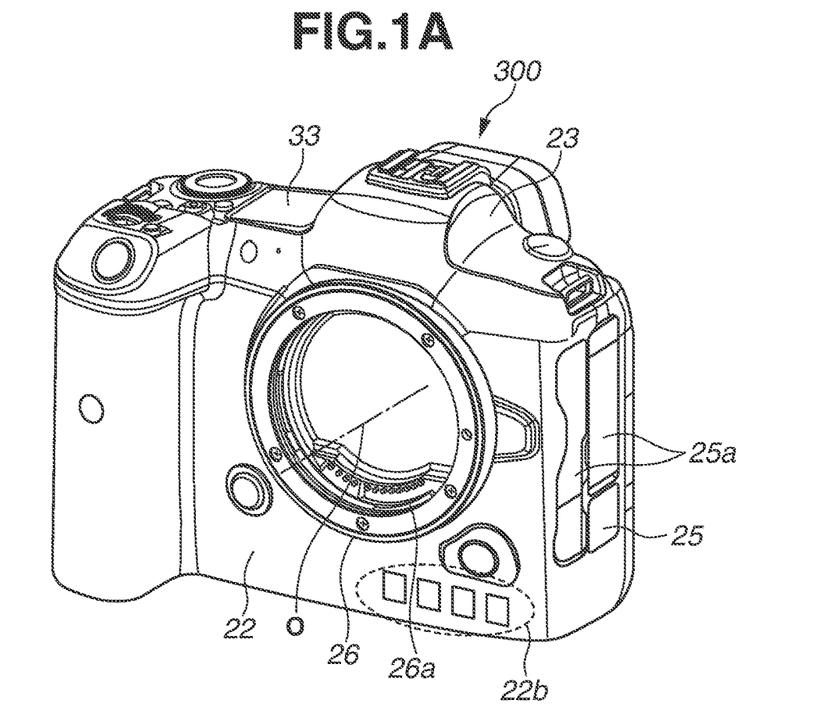
FIG. 1A is a front perspective view of an image capturing apparatus according to an exemplary embodiment of the present disclosure.
Figure 1B:
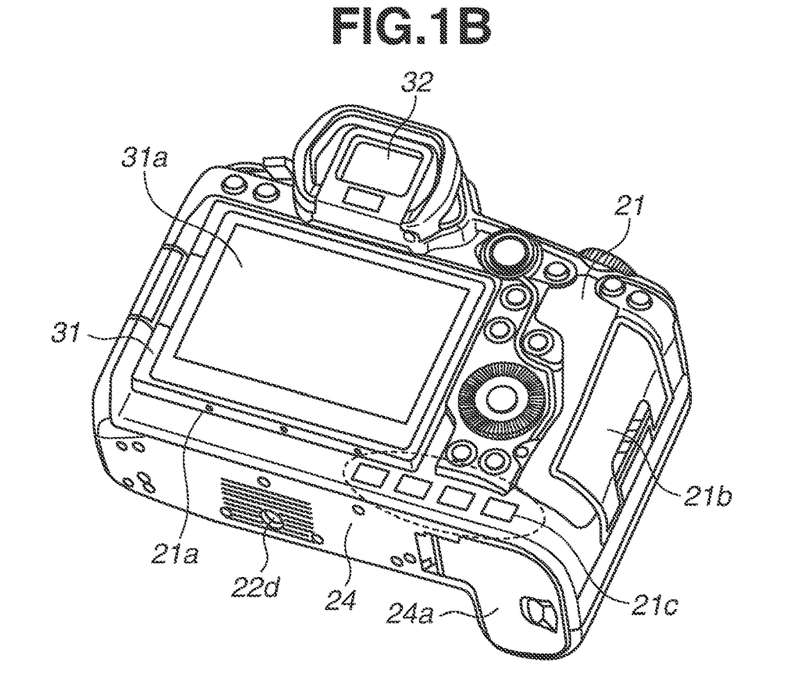
FIG. 1B is a rear perspective view thereof.

FIGS. 1A and 1B are respectively a front perspective view and a rear perspective view of an image capturing apparatus 300.

The image capturing apparatus 300 includes a built-in heat dissipation mechanism 320 described below, and the air sucked from a ventilation hole 21c provided on a rear cover 21 passes through a duct 310 described below and is exhausted from a ventilation hole 22b provided on a front base 22.

The ventilation hole 21c is arranged on a rear surface of the image capturing apparatus 300 and arranged below the rear surface display unit 450. The ventilation hole 22b is arranged on a front surface of the image capturing apparatus 300 and arranged below an image capturing area.

Regarding the air flow according to the present exemplary embodiment, the air is sucked from the ventilation hole 21c and exhausted from the ventilation hole 22b as described above. However, as long as a desired cooling effect can be achieved, the air can be sucked from the ventilation hole 22b and exhausted from the ventilation hole 21c.

<Exploded Perspective View of Internal Structure of Image Capturing Apparatus 300>

Figure 2:
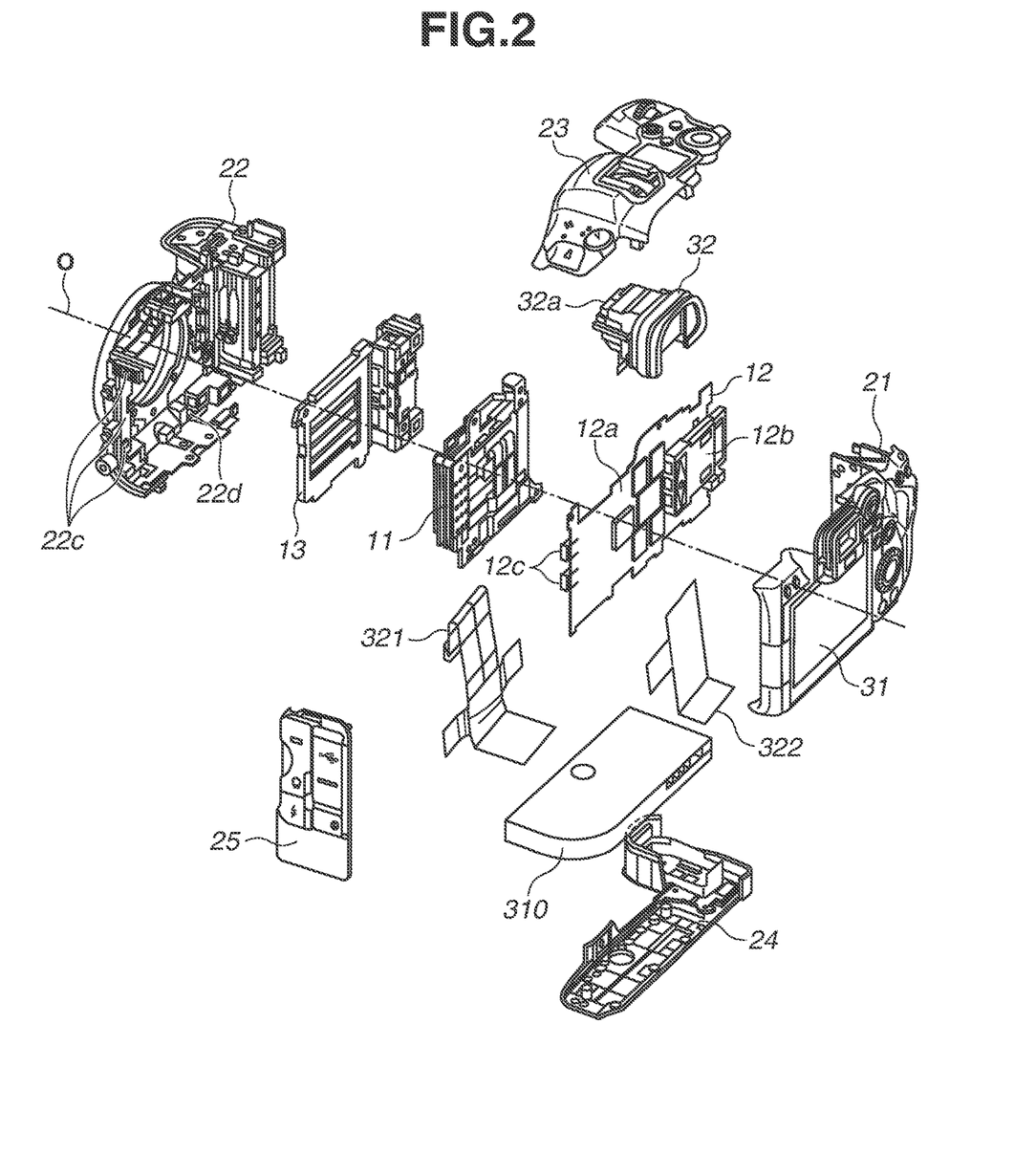
FIG. 2 is an exploded perspective view of the image capturing apparatus according to the exemplary embodiment of the present disclosure.

FIG. 2 is an exploded perspective view illustrating an internal structure of the image capturing apparatus 300.

As illustrated in FIG. 2, the image capturing element board 11 that is a first heat source, the main board 12 that is a second heat source, and the duct 310 are housed within the image capturing apparatus 300. The duct 310 is arranged below a plurality of heat sources described above.

<Exploded Perspective View as Excerpt of Duct 310 and Plurality of Heat Sources>

Figure 3:
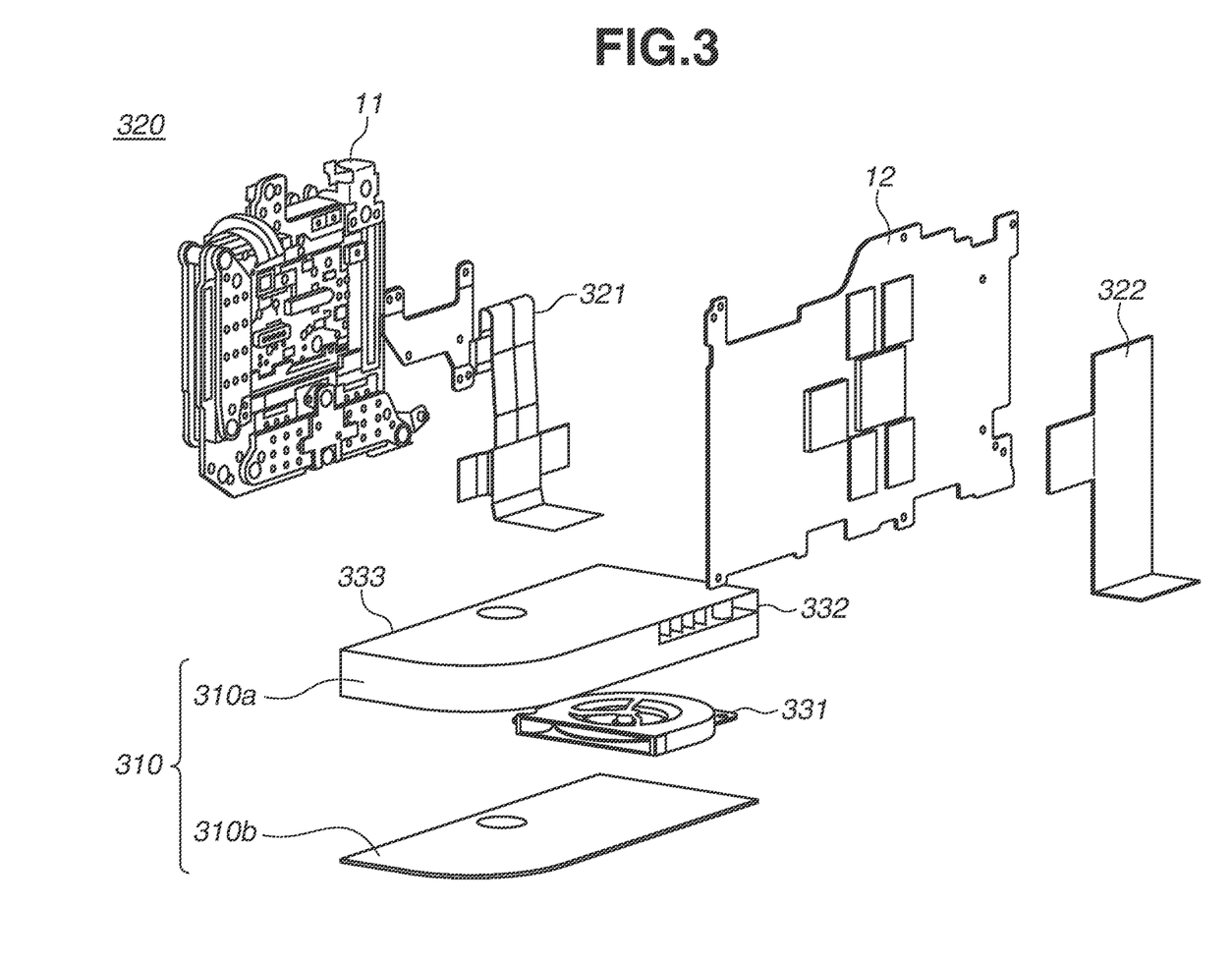
FIG. 3 illustrates a heat dissipation mechanism according to the exemplary embodiment of the present disclosure.

The heat dissipation mechanism 320 is described with reference to FIG. 3, which is an exploded perspective view in which the duct 310 and the plurality of heat sources are excerpted.

The duct 310 includes mainly a duct upper lid 310a, a duct lower lid 310b, and a centrifugal fan (heat dissipation fan) 331.

The centrifugal fan 331 is an air blowing unit for generating an air flow in the duct 310 and is fixed to the inside of the duct 310 with a screw not illustrated.

The duct upper lid 310a and the duct lower lid 310b are fixed while sandwiching an elastic member, which is not illustrated, therebetween. Accordingly, the duct 310 is formed as a closed space.

A fixing method of the above-described duct upper lid 310a and duct lower lid 310b can be any method which can hermetically fix them, and any fastening method such as screwing, adhesion, and swaging can be used as long as a purpose can be achieved.

It is desirable that the duct upper lid 310a and the duct lower lid 310b are made of a material having high thermal conductivity and low specific gravity, which efficiently diffuses and cools the heat from the heat source and hardly affects a weight of the image capturing apparatus 300. According to the present exemplary embodiment, the duct upper lid 310a and the duct lower lid 310b are made of aluminum metal.

The duct 310 includes a suction hole 332 and an exhaust hole 333 and generates an air flow inside the duct 310 by the centrifugal fan 331.

An elastic member, which is not illustrated, is provided between the suction hole 332 and the ventilation hole 21c provided on the rear cover 21, so that a closed structure is formed between the suction hole 332 and the ventilation hole 21c.

An elastic member, which is not illustrated, is provided between the exhaust hole 333 and the ventilation hole 22b provided on the front base 22, so that a closed structure is formed between the exhaust hole 333 and the ventilation hole 22b.

A space between the ventilation hole 21c and the ventilation hole 22b is formed as one closed space with the above-described configuration, so that an air flow path is formed.

At the same time, it is possible to prevent a water droplet, sand, and the like from flowing into the image capturing apparatus 300 from the outside.

A connection with the heat source is described.

The duct 310 and the image capturing element board 11 serving as the first heat source are connected by a first heat conductive member 321. Further, the duct 310 and the main board 12 serving as the second heat source are connected by a second heat conductive member 322.

Heat is released to the duct 310 with the first and the second heat conductive members 321 and 322, and thus a temperature rise can be suppressed.

The first and the second heat conductive members 321 and 322 are made of a member having high thermal conductivity such as a graphite sheet and a heat pipe.

<Efficient Thermal Connection by Second Heat Dissipation Fin 312>

Figure 4:
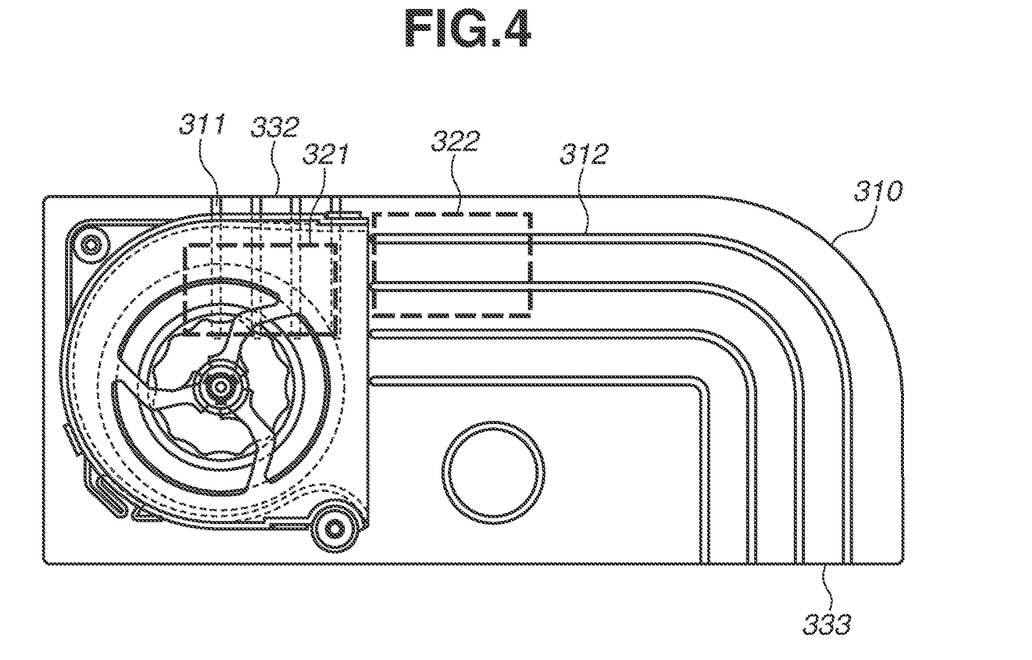
FIG. 4 illustrates a structure of a duct according to the exemplary embodiment of the present disclosure.

An efficient thermal connection is described with reference to FIG. 4.

A first heat dissipation fin 311 having a convex shape and a second heat dissipation fin 312 having a convex shape are provided inside the duct 310. These fins 311 and 312 increase a surface area of the duct 310 to diffuse heat, and improve cooling efficiency.

The first heat dissipation fin 311 is arranged on a suction side of the centrifugal fan 331, and the first heat conductive member 321 is connected to a vicinity of the first heat dissipation fin 311.

The second heat dissipation fin 312 is arranged on an exhaust side of the centrifugal fan 331, and the second heat conductive member 322 is connected to a vicinity of the second heat dissipation fin 312.

The centrifugal fan 331 is driven, and the air sucked from the suction hole 332 passes through the first heat dissipation fin 311 and the second heat dissipation fin 312.

At that time, the air is warmed by the first heat conductive member 321 and the second heat conductive member 322, and the first heat dissipation fin 311 and the second heat dissipation fin 312 are cooled. The warmed air passes through the exhaust hole 333 and is exhausted from the ventilation hole 22b to the outside of the image capturing apparatus 300.

The main board 12 serving as the second heat source is a heat source having a temperature higher than that of the image capturing element board 11 serving as the first heat source. The main board 12 is connected to the exhaust side of the centrifugal fan 331, and thus a high-temperature wind is exhausted faster.

According to the present exemplary embodiment, the centrifugal fan is used as the air blowing unit, but the present exemplary embodiment is not limited to the centrifugal fan and can adopt, for example, an axial flow fan as long as a purpose can be achieved.

<Arrangement of Tripod Mount 22d>

Figure 5:
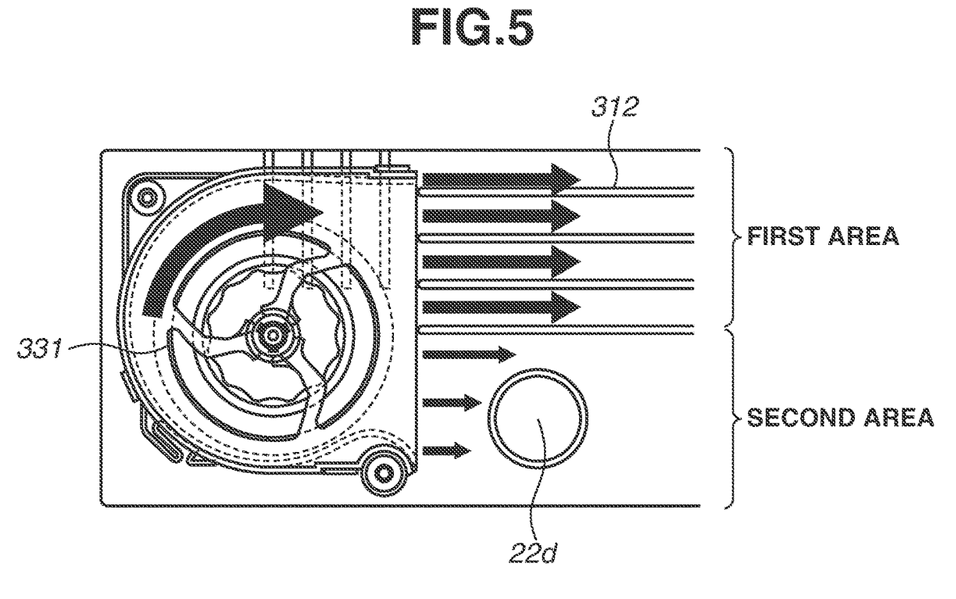
FIG. 5 illustrates an air volume of the duct according to the exemplary embodiment of the present disclosure.

An arrangement of a tripod mount 22d is described with reference to FIG. 5.

Since the duct 310 is arranged on a bottom surface of the image capturing apparatus 300, the tripod mount 22d overlaps with the duct 310 in arrangement and blocks a passage of the wind.

According to the present exemplary embodiment, a range in which an air volume exhausted from the centrifugal fan 331 is large is regarded as a first area, a range in which the air volume is small is regarded as a second area, and the tripod mount 22d is arranged in the second area.

The tripod mount 22d is arranged in the second area in which the air volume is small, while the heat dissipation fins are arranged in the first area in which the air volume is large. Accordingly, heat dissipation can be prevented from deteriorating.

<Comparison Data of Heat Dissipation Effect>

TABLE 1

|  | Digital Camera (Comparative Example) (No Fan) | Digital Camera of Exemplary Embodiment (With Fan) |
| --- | --- | --- |
| Image Capturing Element Board 11 | 111.5° C. | 63.0° C. |
| Main Board 12 | 95.6° C. | 91.6° C. |

Table 1 is a comparison table of highest reaching temperatures of the digital camera according to the present exemplary embodiment and a digital camera according to a comparative example that does not include the centrifugal fan 331 and the duct 310 in a case where image capturing and recording were performed at 8K30P in an environment of 23° C. "8K30P" means moving image recording of 30 frames per second at 8K resolution.

According to the present exemplary embodiment, the centrifugal fan 331 was in a state of being operated at a wind speed of 12 L/min. Liter per minute (L/min) is a unit of volumetric flow rate.

As indicated in Table 1, the highest reaching temperatures of the image capturing element board 11 and the main board 12 were respectively lowered from 111.5° C. to 63.0° C., and from 95.6° C. to 91.6° C. because of the provision of the centrifugal fan 331 and the duct 310.

These results indicate that the temperature rise of the heat sources can be suppressed. In a case where a control temperature at which the digital camera stops functioning is set to 95° C. or less, the configuration according to the present exemplary embodiment can realize unlimited 8K30P image capturing in the environment of 23° C.

Each exemplary embodiment and modification are examples for describing the technique according to the present disclosure, and the technique according to the present disclosure can be appropriately modified or combined without departing from the spirit and the scope of the present disclosure. Specifically, the present disclosure can be broadly applied to an electronic device and an image capturing apparatus having a moving image capturing function such as a video camera and a network camera without being limited to a digital camera.

Hereinbelow, the present exemplary embodiment of the present disclosure is simply described with reference mainly to FIG. 6.

Figure 6:
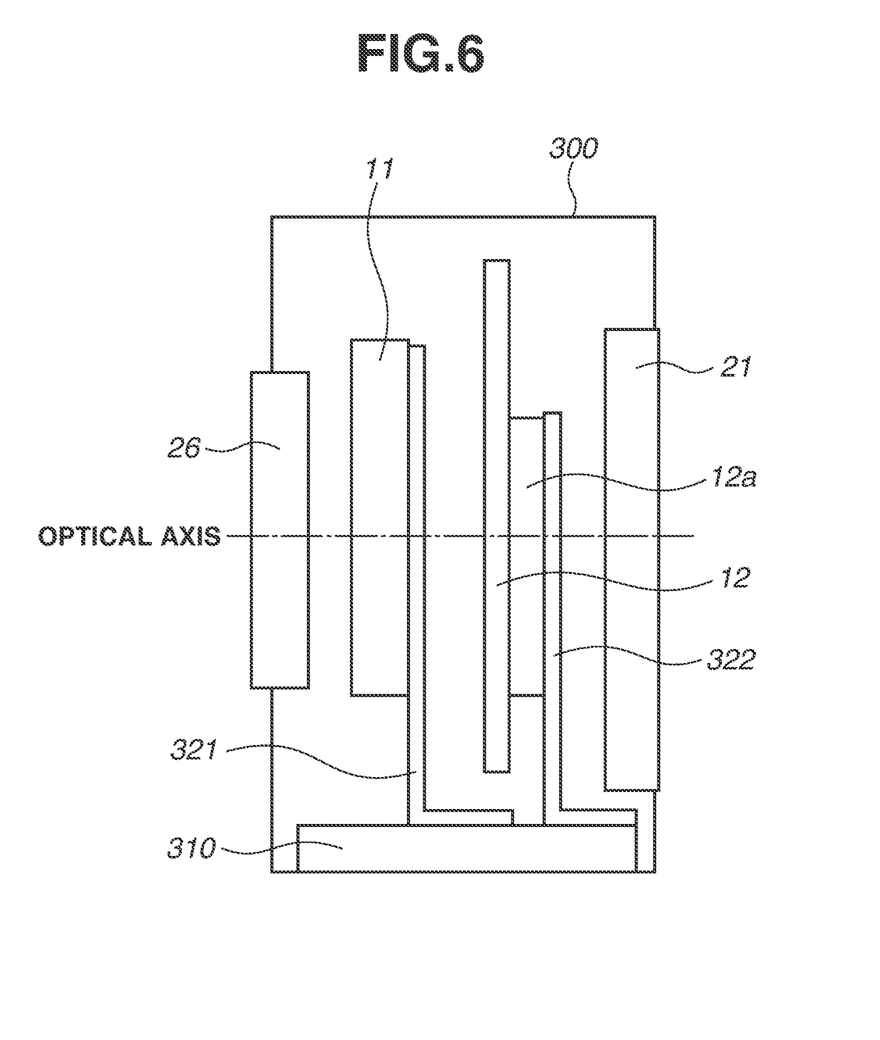
FIG. 6 is a schematic diagram illustrating an internal structure of the duct according to the exemplary embodiment of the present disclosure.

As illustrated in FIG. 6, the image capturing element board 11 serving as the first heat source, a control circuit 12a mounted on the main board 12 serving as the second heat source, and the duct 310 on a bottom surface portion are housed within the image capturing apparatus 300.

The duct 310 and the image capturing element board 11 serving as the first heat source are connected by the first heat conductive member 321. Further, the duct 310 and the main board 12 serving as the second heat source are connected by the second heat conductive member 322. The heat can be released to the duct 310 with the first and the second heat conductive members 321 and 322 as described above, and thus the temperature rise can be suppressed.

The image capturing apparatus 300 includes the control circuit 12a that controls the image capturing apparatus 300, a display panel 31 arranged on a rear surface side of exterior members 21 to 25, and the centrifugal fan 331 arranged on a bottom surface side of the exterior members 21 to 25.

The image capturing element board 11 on which an image capturing element is mounted, the main board 12 on which the control circuit 12a is mounted, and the display panel 31 are arranged in the order from a front surface side to the rear surface side in an optical axis direction.

The duct 310 in which the suction hole 332 is formed on a bottom surface side of the rear cover 21 or a side surface 25 of the exterior members extends from the rear surface side to the front surface side in the optical axis direction.

Further, the duct 310 passes through an area among the image capturing element board 11, the main board 12, and a bottom surface 24 of the exterior members and is connected to the exhaust hole 333, which is formed on the bottom surface side of the exterior members so as to face the suction hole 332 across an optical axis O.

The centrifugal fan 331 is arranged inside the duct 310, which is arranged in the area among the image capturing element board 11, the main board 12, and the bottom surface 24 of the exterior members.

The first heat dissipation fin 311 is arranged inside the duct 310 and arranged on the suction side of the centrifugal fan 331, and the first heat conductive member 321 thermally connected to the image capturing element board 11 is thermally connected directly above the first heat dissipation fin 311.

The second heat dissipation fin 312 is arranged inside the duct 310 and arranged on the exhaust side of the centrifugal fan 331, and the second heat conductive member 322 thermally connected to the main board 12 is thermally connected directly above the second heat dissipation fin 312.

A fixing portion of the tripod mount 22d is provided on the bottom surface 24 of the exterior members and is arranged on the exhaust side of the centrifugal fan 331. In the first area in which the air volume exhausted from the centrifugal fan 331 is large and the second area in which the air volume exhausted from the centrifugal fan 331 is small, the fixing portion of the tripod mount 22d is arranged in the second area, and the second heat dissipation fin 312 is arranged in the first area.

A heat generation temperature of the image capturing element is higher than a heat generation temperature of the control circuit 12a.

The image capturing element board 11 is moved by a movable mechanism in the direction different from the optical axis O for image blur correction.

The movable mechanism configures a voice coil motor (VCM) including a coil and a magnet.

The image capturing element board 11 is driven based on a vibration detection result of an angular velocity detection sensor (gyro) not illustrated.

The image capturing element board 11 is moved in a yaw direction, a pitch direction, and a roll direction around an optical axis of an imaging optical system in order to correct an image blur on an imaging plane of the image capturing element due to a hand shake of a user.

A rotation axis of the centrifugal fan 331 is in a direction perpendicular to the optical axis, and the exhaust hole 333 formed on the bottom surface side of the exterior members is formed on the front base 22 or the side surface 25 of the exterior members.

To conduct the heat of the image capturing element board 11 to the duct 310, the first heat conductive member 321 is provided on which the image capturing element board 11 is formed.

To conduct the heat of the main board 12 to the duct 310, the second heat conductive member 322 is provided on which the main board 12 is formed.

The first heat conductive member 321 has higher thermal conductivity than the second heat conductive member 322.

INDUSTRIAL APPLICABILITY

The technique according to the present disclosure is applied to an electronic device and an image capturing system.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-040119, filed Mar. 12, 2021, which is hereby incorporated by reference herein in its entirety.

What is claimed is:

1. An image capturing apparatus including an image capturing element and having an optical axis, the image capturing apparatus comprising:
   a control circuit configured to control the image capturing apparatus;
   a display panel arranged on a rear surface side of an exterior member; and
   a heat dissipation fan arranged on a bottom surface side of the exterior member,
   wherein an image capturing element board on which the image capturing element is mounted, a control circuit board on which the control circuit is mounted, and the display panel are arranged in an order from a front surface side of the image capturing apparatus to a rear surface side of the image capturing apparatus in a direction of the optical axis,
   wherein a duct, in which a first ventilation hole is formed on a bottom surface side of a rear surface or a side surface of the exterior member extends from the rear surface side to the front surface side in the optical axis direction, passes through an area among the image capturing element board, the control circuit board, and the bottom surface side of the exterior member, and is connected to a second ventilation hole formed on the bottom surface side of the exterior member to face the first ventilation hole across the optical axis, and
   wherein the heat dissipation fan is arranged inside the duct arranged in the area among the image capturing element board, the control circuit board, and the bottom surface side of the exterior member.

2. The image capturing apparatus according to claim 1, wherein a first fin is arranged inside the duct and on a suction side of the heat dissipation fan, and a first heat conductive member that is thermally connected to the image capturing element board is thermally connected directly above the first fin.

3. The image capturing apparatus according to claim 2, wherein a second fin is arranged inside the duct and on an exhaust side of the heat dissipation fan, and a second heat conductive member that is thermally connected to the control circuit board is thermally connected directly above the second fin.

4. The image capturing apparatus according to claim 1, further comprising a fixing portion of a tripod on the bottom surface side of the exterior member,
   wherein the fixing portion of the tripod is arranged on an exhaust side of the heat dissipation fan, and in a first area having a first air volume of the heat dissipation fan and in a second area in which a second air volume of the heat dissipation fan is smaller than the first volume of air, the fixing portion of the tripod is arranged in the second area, and a second fin is arranged in the first area.

5. The image capturing apparatus according to claim 1, wherein a heat generation temperature of the image capturing element is higher than a heat generation temperature of the control circuit.

6. The image capturing apparatus according to claim 1, wherein the image capturing element board is moved in a direction different from the optical axis for image blur correction.

7. The image capturing apparatus according to claim 1, wherein a rotation axis of the heat dissipation fan is in a direction perpendicular to the optical axis, and a second ventilation hole formed on the bottom surface side of the exterior member is formed on a front surface side of the exterior member or a side surface of the exterior member.

8. The image capturing apparatus according to claim 1, further comprising:
   a first heat conductive member on which the image capturing element board is formed and that is configured to conduct heat of the image capturing element board to the duct; and
   a second heat conductive member on which the control circuit board is formed and that is configured to conduct heat of the control circuit board to the duct,
   wherein the first heat conductive member has higher thermal conductivity than the second heat conductive member.

* * * * *